United States Patent
Eroz et al.

(10) Patent No.: US 8,201,048 B2
(45) Date of Patent: *Jun. 12, 2012

(54) METHOD FOR A GENERAL NEAR OPTIMAL TURBO CODE TRELLIS TERMINATION

(75) Inventors: Mustafa Eroz, Germantown, MD (US); A. Roger Hammons, Jr., North Potomac, MD (US)

(73) Assignee: The DIRECTV Group, Inc., El Segundo, CA (US)

(*) Notice: Subject to any disclaimer, the term of this patent is extended or adjusted under 35 U.S.C. 154(b) by 1259 days.

This patent is subject to a terminal disclaimer.

(21) Appl. No.: 11/981,185

(22) Filed: Oct. 31, 2007

(65) Prior Publication Data
US 2008/0065955 A1   Mar. 13, 2008

Related U.S. Application Data

(63) Continuation of application No. 11/051,605, filed on Feb. 4, 2005, now Pat. No. 7,487,431, which is a continuation of application No. 10/023,509, filed on Dec. 18, 2001, now Pat. No. 6,862,706, which is a continuation of application No. 09/378,625, filed on Aug. 20, 1999, now Pat. No. 6,332,209.

(60) Provisional application No. 60/098,111, filed on Aug. 27, 1998.

(51) Int. Cl.
*H03M 13/29* (2006.01)
(52) U.S. Cl. ........................................ 714/755
(58) Field of Classification Search ............. 714/755
See application file for complete search history.

(56) References Cited

U.S. PATENT DOCUMENTS

| | | |
|---|---|---|
| 5,687,095 A | 11/1997 | Haskell et al. |
| 5,721,745 A | 2/1998 | Hladik et al. |
| 5,742,612 A | 4/1998 | Gourgue et al. |
| 5,907,582 A | 5/1999 | Yi |
| 5,910,182 A | 6/1999 | Dent et al. |
| 5,944,850 A | 8/1999 | Chouly et al. |
| 5,970,085 A | 10/1999 | Yi |

(Continued)

FOREIGN PATENT DOCUMENTS
DE   19520987   12/1996
(Continued)

OTHER PUBLICATIONS

Notice of Allowance dated Feb. 4, 2010 in U.S. Appl. No. 11/980,921, filed Oct. 31, 2007 by Mustafa Eroz et al.

(Continued)

*Primary Examiner* — Stephen Baker

(57) ABSTRACT

A method of terminating two or more constituent encoders of a turbo encoder employing a turbo code, comprising the step of: generating tail input bits at each of two or more constituent encoders, including deriving the tail input bits from each of the two or more constituent encoders separately from a contents of shift registers within each of the two or more constituent encoders, after an encoding of information bits by the two or more constituent encoders; puncturing one or more tail output bits such that 1/R output tail bits are transmitted for each of a plurality of trellis branches, wherein R is a turbo code rate employed by the turbo encoder during an information bit transmission. In yet another variation, the step of puncturing the tail output bits further comprises the step of: transmitting, during trellis termination, the tail output bits, only if they are sent from an output branch of one of the two or more constituent encoders that are used during information bit transmission.

20 Claims, 1 Drawing Sheet

U.S. PATENT DOCUMENTS

| | | | |
|---|---|---|---|
| 5,978,414 | A | 11/1999 | Nara |
| 5,983,384 | A | 11/1999 | Ross |
| 5,987,067 | A | 11/1999 | Song |
| 5,996,104 | A | 11/1999 | Herzberg |
| 6,023,783 | A | 2/2000 | Divsalar et al. |
| 6,088,387 | A | 7/2000 | Gelblum et al. |
| 6,094,427 | A | 7/2000 | Yi |
| 6,289,486 | B1 | 9/2001 | Lee et al. |
| 6,332,209 | B1 * | 12/2001 | Eroz et al. ............... 714/790 |
| 6,334,197 | B1 | 12/2001 | Eroz et al. |
| 6,339,834 | B1 | 1/2002 | Crozier et al. |
| 6,347,385 | B1 | 2/2002 | Cui et al. |
| 6,370,669 | B1 | 4/2002 | Eroz et al. |
| 6,430,722 | B1 | 8/2002 | Eroz et al. |
| 6,519,732 | B1 | 2/2003 | Li |
| 6,530,059 | B1 | 3/2003 | Crozier et al. |
| 6,665,829 | B2 | 12/2003 | Eroz et al. |
| 6,862,706 | B2 * | 3/2005 | Eroz et al. ............... 714/755 |
| 7,487,431 | B2 * | 2/2009 | Eroz et al. ............... 714/790 |
| 7,779,329 | B2 * | 8/2010 | Eroz et al. ............... 714/755 |
| 7,827,465 | B2 * | 11/2010 | Eroz et al. ............... 714/755 |
| 2002/0087923 | A1 | 7/2002 | Eroz et al. |
| 2002/0166093 | A1 | 11/2002 | Eroz et al. |
| 2003/0041297 | A1 | 2/2003 | Eroz et al. |
| 2003/0051205 | A1 | 3/2003 | Eroz et al. |

FOREIGN PATENT DOCUMENTS

| | | |
|---|---|---|
| DE | 19736653 | 12/1998 |
| EP | 0300139 | 1/1989 |
| EP | 0952673 | 10/1999 |
| JP | 62-190932 | 8/1987 |
| JP | 7-202851 | 8/1995 |
| JP | 11-68734 | 3/1999 |
| WO | WO 96/37050 | 11/1996 |
| WO | WO 98/48517 | 10/1998 |
| WO | WO 99/07076 | 2/1999 |
| WO | WO 00/13323 | 3/2000 |
| WO | WO 00/41343 | 7/2000 |
| WO | WO 00/48353 | 8/2000 |

OTHER PUBLICATIONS

EPO Communication dated Jan. 31, 2011 in European divisional Patent Application No. 09075131.4 filed Aug. 20, 1999 by Mustafa Eroz et al.
EPO Communication dated Jul. 7, 2008 in European counterpart Application No. 04076516.6 corresponding to U.S. Appl. No. 09/378,625, filed Aug. 20, 1999, now issued Dec. 18, 2001 as US Patent No. 6,332,209.
Non-final Office Action dated Oct. 14, 2009 in U.S. Appl. No. 11/980,914, filed Oct. 31, 2007 by Mustafa Eroz et al.
Non-final Office Action dated Oct. 14, 2009 in U.S. Appl. No. 11/980,921 filed Oct. 31, 2007 by Mustafa Eroz et al.
EPO communication dated Dec. 3, 2009 in European divisional Patent Application No. 04011909.1 filed Aug. 20, 1999 (parent filing date of EP Patent Application No. 99943834.4, now EP Patent No. 1050110) by Mustafa Eroz et al.
Blackert, W.J.; Hall, E.K.; Wilson, S.G.; "Turbo Code Termination and Interleaver Conditions"; Electronics Letters; vol. 31, No. 24; Nov. 1995; pp. 2082-2084.
Non-final Office Action dated Mar. 24, 2009 in U.S. Appl. No. 11/980,921, filed Oct. 31, 2007 by Mustafa Eroz et al.
Non-final Office Action dated Mar. 24, 2009 in U.S. Appl. No. 11/980,914, filed Oct. 31, 2007 by Mustafa Eroz et al.
EPO Communication dated Apr. 11, 2008 in European Application No. 04076513.3, a divisional of European Application No. 99943834.4 corresponding to U.S. Appl. No. 09/378,625, filed Aug. 20, 1999, now issued as Patent No. 6,332,209.
EPO Communication dated Jun. 18, 2010 in European Patent Application No. 04011909.1 filed May 19, 2004 (divisional of European Patent Application No. 99943834.4) by Mustafa Eroz et al.
Ho, Mark S.C. et al., "Improving the Constituent Codes of Turbo Encoders", IEEE Globecom 1998, Globecom 1998 The Bridge to Global Integration, Sydney, Nov. 8-12, 1998.
Anderson, J.D. et al., "Interleaver Design for Turbo Coding".
Divsalar, D. et al., "Multiple Turbo Codes", Proceedings of the Military Communications Conference (Milcom), San Diego, No. 6-8 1995, vol. 1, Nov. 6, 1995, Institute of Electrical and Electronics Engineers ISBN, XP-000580788.
Divsalar, D. et al., "Turbo Codes for PCS Applications", Jun. 18, 1995, pp. 54-59, XP-000532968.
Divsalar, D. et al., "Effective Free Distance of Turbo Codes", Electronics Letters, vol. 32, No. 5, Feb. 29, 1996, pp. 445-446.
Divsalar, D. et al., "On the Design of Turbo Codes", TDA Progress Report 42-123, Nov. 15, 1995, pp. 99-121.
Lee, Lin-Nan at al., "Turbo Code and Its Performance", TIA TR45. 5.4, Dec. 8, 1997.
Lee, Lin-Nan et al., "Third Generation Wireless Technologies—Expectations and Realities", Ninth IEEE International Symposium on Personal, Indoor and Mobile Radio Communications (Cat. No. 98TH 8361), Proceedings of Ninth International Symposium on Personal, Indoor and Mobile Radio Communications (PIMRC '98), Boston, MA, USA, Sep. 8-11, 1998, pp. 79-83, vol. 1, 1998 New York, NY USA, IEEE USA ISBN.
Benedetto, S. et al., "Unveiling Turbo Codes: Some Results on Parallel Concatenated Coding Schemes", IEEE Transactions on Information Theory, vol. 42 No. 2, Mar. 1, 1996, pp. 409-428, XP-002057508.
Benedetto, S. et al.. "Design of Parallel Concatenated Convolutional Codes", IEEE Transactions on Communication, vol. 44, No. 5, May 1996.
Benedetto, S. et al., "System Encoders for Convolutional Codes and Their Application to Turbo Codes", 0-7803-3336-5/96 IEEE, 1996, pp. 6-10.
Berrou et al., "Near Shannon Limit Error-Correcting Code and Decoding: Turbo Codes", May 23, 1993, pp. 1064-1070, XP-000371240.
Maric, "Class of Algebraically Constructed Permutations for Use in Pseudorandom Interleavers", Electronics Letters, vol. 30, No. 17, Aug. 18, 1994, pp. 1378-1379.
Eroz et al., "RTT Text for Turbo Codes", ETSI SMG2UMTS-L1, Oslo, Norway, Apr. 1, 1998.
Eroz et al., "FER and BER Comparisons of Turbo versus Convolutional Codes", ETSI SMG2UMTS-L1, Paris, France, Apr. 28, 1998.
Acikel, O.F. et al., "High Rate Turbo Codes for BPSK/QPSK Channels", ICC '98, 1998 IEEE International Conference on Communications, Jun. 7-11, 1998, pp. 422-427, vol. 1.
Riedel, S., "Symbol-by-Symbol MAP Decoding Algorithm for High-Rate Convolutional Codes that Use Reciprocal Dual Codes", IEEE Journal on Selected Areas in Communications, Vo. 18, No. 2, Feb. 1, 1998, pp. 175-185.
Rowitch, D.N. et al., "Rate Compatible Punctured Turbo (RCPT) Codes in a Hybrid FEC/ARQ System", 1997 IEEE Global Telecommunications Mini-Conference, vol. 4, Nov. 1999, pp. 55-59.
Chan et al., "An Adaptive Hybrid FEC/ARQ Protocol Using Turbo Codes", 1997 IEEE 6th International Conference on Universal Personal Communications, Oct. 1997, pp. 541-545.
Barbulescu et al., "Rate Compatible Turbo Codes", Electronics Letters, vol. 31, No. 7, Mar. 30, 1995, pp. 535-536.
Lgic, "Puncturing Algorithm for Turbo", 3GPP/TSG/RAN/WG1#4, TDOC 338/99, Apr. 19-20, 1999, pp. 1-6, Yokohama, Japan, p. 1, line 1-p. 6, last line, fig. 2, XP-002184254.
Blackert et al., "An Upper Bound on Turbo Code Fee Distance", ICC 1996, Jun. 1996, pp. 957-961.
Fei et al., "The Effects of Time Delay Spread on Turbo-TCM in a Wireless Communication Channel", 1997 IEEE 47th Vehicular Technology Conference, May 1997, pp. 334-338.
Reed, M. C. et al.; "Turbo-Code Termination Schemes and a Novel Alternative for Short Frames"; IEEE International Symposium on Personal, Indoor and Mobile Radio Communications; Oct. 15, 1996; pp. 354-358; XP002050626.
Japanese Office Communication dated Dec. 2, 2003 in Japanese counterpart application No. 2000-568190.
Japanese Office Communication dated Apr. 25, 2006 in Japanese divisional counterpart application No. 2004-159901.
Japanese Office Communication dated Dec. 19, 2006 in Japanese divisional counterpart application No. 2004-159901.
EPO extended European Search Report dated Jan. 25, 2010 in European Patent Application No. 09075131.4 filed Aug. 20, 1999 (parent filing date of European Patent Application No. 99943834.4, now EP Patent 1050110) by Mustafa Eroz et al.; 6 pages.

* cited by examiner

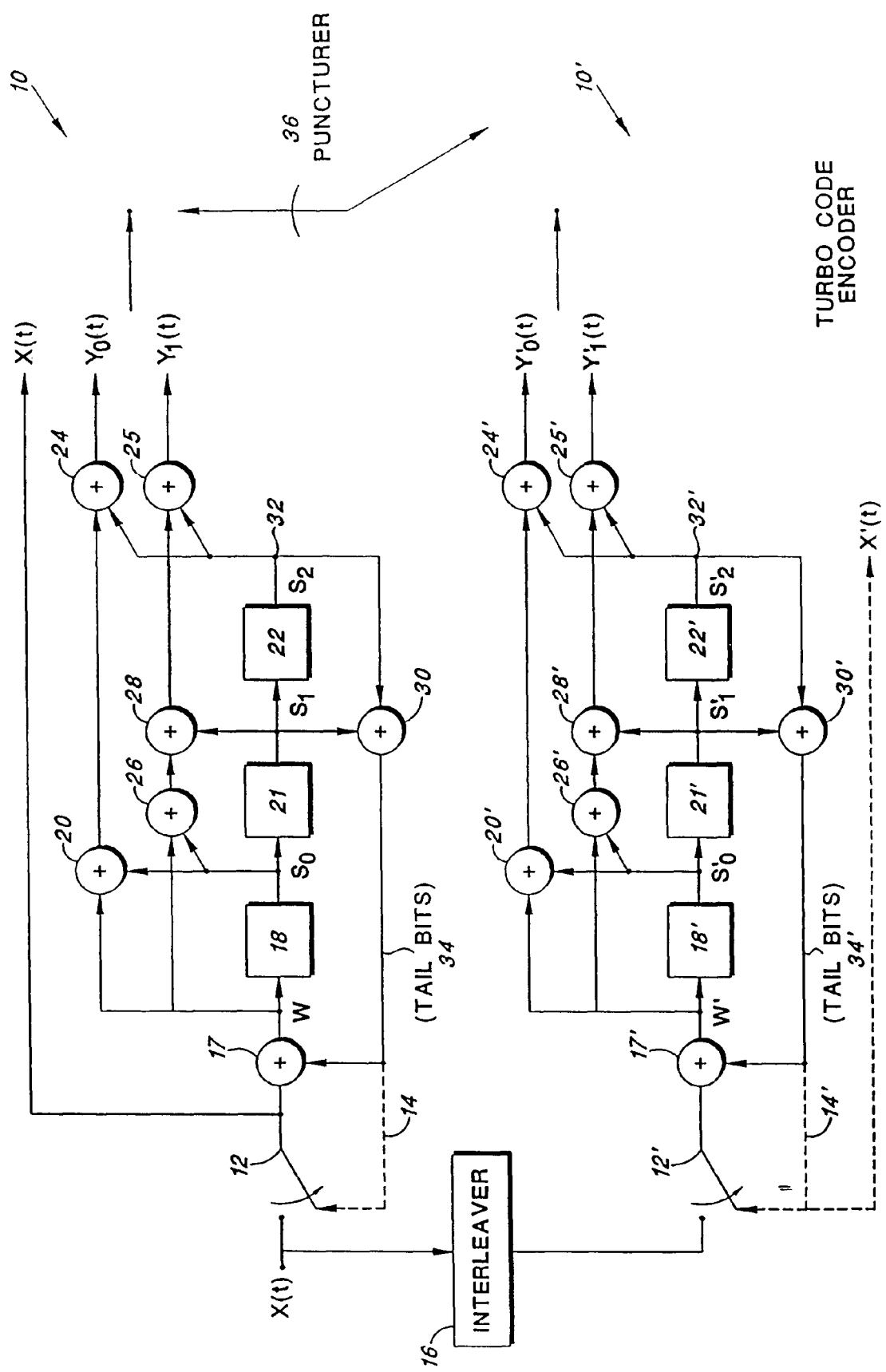

METHOD FOR A GENERAL NEAR OPTIMAL TURBO CODE TRELLIS TERMINATION

This application is a continuation of U.S. application Ser. No. 11/051,605, filed Feb. 4, 2005, entitled "METHOD FOR A GENERAL NEAR OPTIMAL TURBO CODE TRELLIS TERMINATION" by Mustafa Eroz et al., now U.S. Pat. No. 7,487,431, issued Feb. 3, 2009, which is a continuation of U.S. application Ser. No. 10/023,509, filed Dec. 18, 2001, entitled "METHOD FOR A GENERAL NEAR OPTIMAL TURBO CODE TRELLIS TERMINATION" by Mustafa Eroz et al., now U.S. Pat. No. 6,862,706, issued Mar. 1, 2005, which is a continuation of U.S. application Ser. No. 09/378,625, filed Aug. 20, 1999, entitled "METHOD FOR A GENERAL TURBO CODE TRELLIS TERMINATION" by Mustafa Eroz et al., now U.S. Pat. No. 6,332,209, issued Dec. 18, 2001, which claims benefit of U.S. Provisional Application Ser. No. 60/098,111, filed Aug. 27, 1998.

BACKGROUND OF THE INVENTION

The present invention relates to methods for terminating both of the constituent encoders of a turbo code and developing puncturing patterns applicable at a trellis termination stage that ensures the same number of transmitted bits for each trellis stage during the information bit transmission and trellis termination stages.

The process of forward and reverse link turbo encoding and decoding, specifically for Code Division Multiple Access (CDMA) communications channels, is thoroughly described in copending U.S. patent application Ser. No. 09/248,338. of Eroz, et al., for SETS OF RATE-COMPATIBLE UNIVERSAL TURBO CODES NEARLY OPTIMIZED OVER VARIOUS RATES AND INTERLEAVER DELAYS, filed Feb. 11, 1999, and copending U.S. patent application Ser. No. 09/235,582, of Eroz, et al., for FORWARD ERROR CORRECTION SCHEME FOR DATA CHANNELS USING UNIVERSAL TURBO CODE, filed Jan. 22, 1999, both of which are incorporated herein by reference.

In a convolutional encoding scheme, tail bits are inserted after information bits, to zero out all shift registers of an encoder. For feed forward encoders, tail bits are equal to zero. For feedback encoders the value of tail bits depend on the contents of the shift register current values.

A turbo encoder consists of a parallel concatenation of two (2) or more recursive (feedback) convolutional encoders. Because each constituent encoder processes the information bits in a different order due to a turbo interleaver, it is not possible to terminate all constituent encoders by the same tail bits.

A trellis termination method general enough to be used for a set of turbo codes with different code rates as in the third generation CDMA systems is desirable. Included in the desirable general method is a method of puncturing tail bit sequences.

SUMMARY OF THE INVENTION

The present invention advantageously addresses the needs above as well as other needs by providing a method and apparatus for a general Turbo Code trellis termination which may be employed when a turbo encoder operates within a wide range of turbo code rates when transmitting information bits.

In its most general form, the invention can be characterized as a method of terminating two or more constituent encoders of a turbo encoder. The method comprises the steps of: generating tail input bits at each of two or more constituent encoders, including the step of deriving the tail input bits from each of the two or more constituent encoders separately from the contents of shift registers within each of the two or more constituent encoders, after an encoding of information bits by the two or more constituent encoders; and puncturing one or more tail output bits such that 1/R tail output bits are transmitted for each of a plurality of trellis stages, wherein R is a turbo code rate employed by the turbo encoder during the information bit transmission.

In yet another variation, the step of puncturing the one or more tail output bits further comprises the step of: transmitting, during trellis termination, the tail output bits only if they are sent from an output branch of one of the two or more constituent encoders that is used during information bit transmission.

BRIEF DESCRIPTION OF THE DRAWINGS

The above and other aspects, features and advantages of the present invention will be more apparent from the following more particular description thereof, presented in conjunction with the following drawings wherein:

FIG. 1 is a block diagram of a turbo encoder with interleaved bits entering a second encoder, for use in accordance with one embodiment of the present invention.

Corresponding reference characters indicate corresponding components throughout the several views of the drawings.

DETAILED DESCRIPTION OF THE PREFERRED EMBODIMENT

The following description of the presently contemplated best mode of practicing the invention is not to be taken in a limiting sense, but is made merely for the purpose of describing the general principles of the invention. The scope of the invention should be determined with reference to the claims.

Referring to FIG. 1, an exemplary turbo code encoder is shown wherein one embodiment of a Turbo Code trellis termination design terminates one encoder 10 (a first encoder) while disabling another encoder 10' (a second encoder) and at a different time terminates the other encoder 10' (second encoder) while disabling the encoder 10 (first encoder).

The encoders (first and second encoders) 10, 10' of the turbo code encoder of FIG. 1 are constituent encoders configured in a parallel concatenation. It is well known in the art that a constituent encoder employ a configuration of modular adders 17, 20, 26, 28, 30, 24, and 25, and shift registers 18, 21, 22, coupled through nodes (such as node 32) to produce output bits, including tail output bits, $X(t)$, $Y_o(t)$, $Y_1(t)$, for example, depending upon the encoding scheme. FIG. 1 is just one example of such a parallel concatenation of constituent encoders, wherein an interleaver device (Interleaver) 16 is employed between an input for $X(t)$ and the second encoder 10', and wherein additionally, a puncturer 36 is employed, switchably coupled to respective encoder outputs for each of the encoders (first and second encoders) 10, 10'. As described herein, tail input bits will mean the bits X, and X' in FIG. 1, and tail output bits will mean the bits X, X', $Y_o$, $Y_o'$, $Y_1$ or $Y_1'$. In other turbo encoders, there may be more than two constituent encoders. Each of the constituent encoders may utilize a fewer or greater number of shift registers than in FIG. 1.

In FIG. 1, after message bits $X(t)$ are encoded, a switch 12 is moved to a feedback position to allow the generation of three (3) consecutive tail input bits, in this example, generated from the contents of each of three shift registers 18, 21, and 22 (also referred to herein as a first shift register 18, a second shift register 21 and a third shift register 22). In general, a number of tail input bits X(t), X'(t) for terminating a constituent encoder is equal to a number of shift registers in that encoder.

At the end of each clock cycle, new tail input bits X(t), X'(t) are generated for zeroing out each respective shift register of the three shift registers, 18, 21 and 22.

In one embodiment of the invention the encoders 10, 10' are terminated simultaneously within three clock cycles, each with its own tail input bit X(t), X'(t). Alternatively, the first encoder 10 is first terminated while the second encoder 10' is disabled, followed by the second encoder 10' being terminated while the first encoder 10 is disabled.

In the variation with the encoders 10, 10' terminated at different times the encoders 10, 10' can be terminated in consecutive clock cycles, wherein six (6) consecutive clock cycle tail input bits X(t), X'(t), consecutively terminate both the encoders 10, 10'.

As can be seen from FIG. 1, a second tail input bit sequence 34' for terminating the second encoder 10' is fed back into the second encoder 10' through a switch 12' and circuit 14'. Tail input bits X(t), X'(t) are not interleaved by the turbo interleaver 16. Similarly, a tail input bit sequence 34 for terminating the first encoder 10 is fed back into the first encoder 10 through another switch 12 and another circuit 14.

The zeroing of the shift registers 18, 21, 22, prior to implementing a puncturing scheme per an embodiment of the invention, is triggered by a beginning and an ending tail input bit sequence X(t), X'(t), each sequence having a number n of tail input bits X(t), X'(t) equal to the number n of shift registers 18, 21, 22 or 18', 21', 22' coupled to each one of the encoders 10, 10'.

As with information and coded bits, tail output bits X, $Y_o$, $Y_1$, X', $Y_o'$, $Y_1'$ are also punctured by the puncturer 36.

Table 1 indicates associated tail output bit puncturing patterns having indicator sequences (e.g., "111 000") identifying which bits to puncture and which bits to transmit. The indicator sequence, comprising "1"'s or "0"'s is selected in accordance with an encoder rate. In this notation, "1" indicates the tail output bit should be transmitted and "0" indicates that the tail output should be punctured. Certain entries in Table 1 are labeled "repeat", which means that transmitted bits are transmitted twice.

The tail input bit sequences 34, 34', which comprise tail input bits X, and X', are generated after the encoders 10, 10' encode the information bits with the switches 12, 12' (FIG.1), while the switches 12, 12' are in an up position. The first n/R tail output bits $X_1$, $Y_o$, $Y_1$, wherein n is the number of shift registers 18, 21, 22 or 18', 21', 22' per constituent encoder (n=3 in FIG. 1), and wherein R is a turbo code rate being employed, are generated by clocking the first encoder 10 n times with its switch 12 in the down position while the second encoder 10' is not clocked, and puncturing or repeating the resulting tail output bits $X_1$, $Y_o$, $Y_1$, X', $Y_o'$, $Y_1'$ according to Table 1 below. The last n/R tail output bits X', $Y_o'$, $Y_1'$ are generated by clocking the second encoder 10' n timer with its switch 12' in the down position while the first encoder 10 is not clocked, and puncturing or repeating the resulting tail output bits according to Table 1. These final output bits are denoted by X', $Y_o'$ or $Y_1'$.

For rate 1/2 turbo codes, the tail output bits for each of a first n tail input bit (also referred to herein as "the beginning tail bit sequence X(t)") are $XY_0$, and the tail output bits for each of a last n tail bit periods (also referred to herein as "the ending tail bit sequence X'(t)") are $X'Y_0'$. For rate 1/3 turbo codes, the tail output bits for each of the first n tail input bits are $XXY_0$, and the tail output bits for each of the last n tail bits are $X'X'Y_0'$. For a rate 1/4 turbo code, the tail output bits for each of the first n tail input bits are $XXY_0Y_1$ and the tail output bits for each of the last n tail input bits periods are $X'X'Y_0'Y_1'$.

Tail inputs bits are not interleaved by the interleaver 16. They are added after the encoding of the information bits.

TABLE 1

Puncturing Patterns for Tail Output Bits

| | Rate | | |
|---|---|---|---|
| | 1/2 | 1/3 | 1/4 |
| X(t) | 111 000 | 111 000 | 111 000 |
| | | Repeat | Repeat |
| $Y_0(t)$ | 111 000 | 111 000 | 111 000 |
| $Y_1(t)$ | 000 000 | 000 000 | 111 000 |
| X'(t) | 000 111 | 000 111 | 000 111 |
| | | Repeat | Repeat |
| $Y_0'(t)$ | 000 111 | 000 111 | 000 111 |
| $Y_1'(t)$ | 000 000 | 000 000 | 000 111 |

When employing Table 1 to design puncturing patterns for tail output bits, the row designation "Repeat" means that for a rate 1/3 or a rate 1/4 turbo code, when transmitted, the bits X and X' are transmitted twice.

For a rate 1/2 turbo code, the puncturing table is read first from top to bottom, and then from left to right. For a rate 1/3 turbo code and a rate 1/4 turbo code, the puncturing table is read first from top to bottom, repeating X(t) and X'(t), and then from left to right.

The puncturing patterns in Table 1 are chosen so that:

(1) A number of transmitted tail output bits during trellis termination is 1/R for each trellis branch wherein R is the turbo code rate employed during information bit transmission. Advantageously, this condition ensures that the same turbo code rate is used for trellis termination as for information bit transmission.

(2) Only output branches of the encoders 10, 10' used during information bit transmission are used for trellis termination. For example, for rate 1/2 and rate 1/3 turbo coders, only X(t), X'(t), $Y_0(t)$ and $Y'_0(t)$ are transmitted during information bit transmission; $Y_1(t)$ and $Y'_1(t)$ are always punctured. Therefore, only X(t), X'(t), $Y_0(t)$ and $Y'_0(t)$ are transmitted during the trellis termination stage, as well. Advantageously, therefore, if a manufacturer only wanted to implement a rate 1/2 and encoder, such a manufacturer would only have to implement transmissions of bits from branches X, $Y_0$ or X', $Y_0'$.

(3) In order to meet conditions (1) and (2), it may require repetition of some tail output bits during trellis termination. That is, to both keep the turbo code rate the same, and to only use output branches used in information bit transmission, it may be necessary to repeat one or more of the tail bits for each encoder 10, 10' in order to keep the turbo code rate the same.

In the preferred embodiment illustrated by Table 1, X(t) and X'(t) are selected to be repeated in both the turbo code rate 1/3 and rate 1/4 cases. Table 1 may also be employed irrespective of whether the encoders 10, 10' are terminated concurrently or non-concurrently.

Alternative embodiments are envisioned, in keeping within the spirit of the invention wherein another tail output bit is selected to be repeated, such as, for example that corresponding to $Y_0(t)$ and $Y_0'(t)$.

Alternatively, where a code rate lower than 1/4 is employed it may be necessary to repeat more than one tail output bit per encoder 10, 10', in which case an additional tail bit besides X(t) may be repeated, such as repeating X(t) and $Y_0(t)$ or repeating X(t) twice or any combination whatsoever.

While the invention herein disclosed has been described by means of specific embodiments and applications thereof, numerous modifications and variations could be made thereto by those skilled in the art without departing from the scope of the invention set forth in the claims.

What is claimed is:

1. A method for turbo encoding, the method comprising:
generating output bits at at least four output branches, the output bits generated by encoding information bits;
transmitting encoded bits from the at least four output branches, the encoded bits selectively transmitted according to at least one code rate (R); and
utilizing values from the encoding process to generate tail output bits.

2. The method of claim 1, wherein the selective transmission is according to a plurality of code rates.

3. The method of claim 1, wherein values resulting from encoding all of the information bits are utilized to generate the tail output bits.

4. The method of claim 1, wherein generating the tail output bits comprises considering the code rate (R).

5. The method of claim 1, wherein the selective transmission is according to the code rate (R).

6. The method of claim 1, further comprising generating output bits at least a fifth and sixth output branch.

7. The method of claim 1, wherein generating output bits at the at least four output branches comprises interleaving information bits from at least two of the output branches.

8. The method of claim 1, wherein the code rate (R) comprises one of 1/2, 1/3 and 1/4.

9. A system for encoding data and providing trellis termination, the system comprising:
a turbo encoder having a turbo code rate of R and comprising two constituent encoders, each encoder comprising shift registers consisting of three shift registers connected in series,
wherein a first encoder of said two encoders is configured to receive and process information bits,
wherein a second encoder of said two encoders is configured to receive and process the information bits from an interleaver,
wherein the turbo encoder is configured to output data bits that comprise information bits and parity bits,
wherein M tail output bits are outputted from the turbo encoder,
wherein the first encoder is configured to output a first set of M/2 tail output bits derived in response to states of the shift registers of the first encoder, and
wherein the second encoder is configured to output a second set of M/2 tail output bits derived in response to states of the shift registers of the second encoder.

10. The system of claim 9, wherein, in each encoder, the tail output bits are derived in response to three tail input bits sequentially provided to the each encoder.

11. The system of claim 9, wherein M tail output bits comprises twelve tail output bits which constitutes six tail output bits from each encoder.

12. The system of claim 9, wherein the turbo code rate R is 1/3.

13. The system of claim 9, wherein the first set of tail output bits are generated from tail input bits derived solely from the states of two shift registers in the first encoder.

14. The system of claim 9, wherein the second set of tail output bits are generated from tail input bits derived solely from the states of two shift registers in the second encoder.

15. A method for encoding data and providing trellis termination, the method comprising:
receiving and processing information bits at a first encoder of a turbo encoder having a turbo code rate of R;
receiving and processing the information bits at a second encoder of the turbo encoder via an interleaver; and
outputting, from the turbo encoder, data bits that comprise information bits and parity bits,
wherein each of the first encoder and the second encoder comprises shift registers consisting of three shift registers connected in series,
wherein M tail output bits are outputted from the turbo encoder,
wherein a first set of M/2 tail output bits are from the first encoder and are derived in response to states of the shift registers of the first encoder, and
wherein a second set of M/2 tail output bits are from the second encoder and are derived in response to states of the shift registers of the second encoder.

16. The method of claim 15, wherein, in each encoder, the tail output bits are derived in response to three tail input bits sequentially provided to the each encoder.

17. The method of claim 15, wherein M tail output bits comprises twelve tail output bits which constitutes six tail output bits from each encoder.

18. The method of claim 15, wherein the turbo code rate R is 1/3.

19. The method of claim 15, wherein the first set of tail output bits are generated from tail input bits derived solely from the states of two shift registers in the first encoder.

20. The method of claim 15, wherein the second set of tail output bits are generated from tail input bits derived solely from the states of two shift registers in the second encoder.

* * * * *